(12) United States Patent
Singh

(10) Patent No.: US 6,859,201 B1
(45) Date of Patent: Feb. 22, 2005

(54) METHOD AND APPARATUS FOR VIEWING A MECHANICAL DESIGN

(75) Inventor: Kapil D. Singh, Westchester, PA (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/239,498

(22) Filed: Jan. 28, 1999

(51) Int. Cl.[7] .................................................. G06T 15/00
(52) U.S. Cl. ................................................................ 345/420
(58) Field of Search .............................. 345/964, 855, 345/441, 420, 419, 619

(56) References Cited

U.S. PATENT DOCUMENTS 5,619,632 A * 4/1997 Lamping et al. ............ 345/441
5,815,154 A * 9/1998 Hirschtick et al. .......... 345/853
6,629,065 B1 * 9/2003 Gadh et al. ..................... 703/1

* cited by examiner

Primary Examiner—Phu K. Nguyen
(74) Attorney, Agent, or Firm—Fish & Richardson P.C.

(57) ABSTRACT

A mechanical design viewing method includes a viewer selecting a first subpart of a mechanical design, and in response, highlighting one or more graphical elements of a dependent graph of the mechanical design for the viewer. The highlighted graphical elements are associated with the selected subpart of the mechanical design. The viewing method also include the viewer selecting graphical elements of the dependent graph, and in response, highlighting a subpart of the mechanical design for the viewer. The highlighted subpart is associated with the selected graphical elements. The viewer may alternate back and forth between the two aspects to explore the mechanical design.

36 Claims, 5 Drawing Sheets

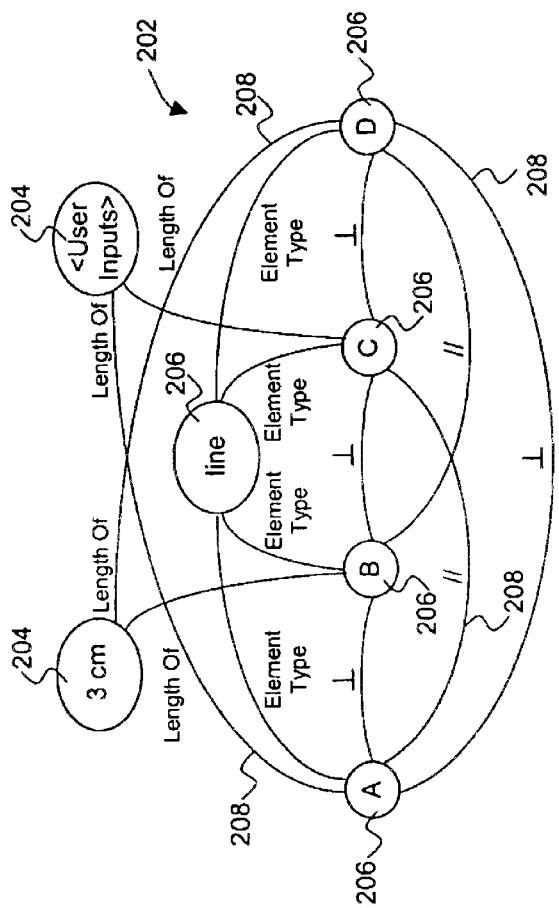
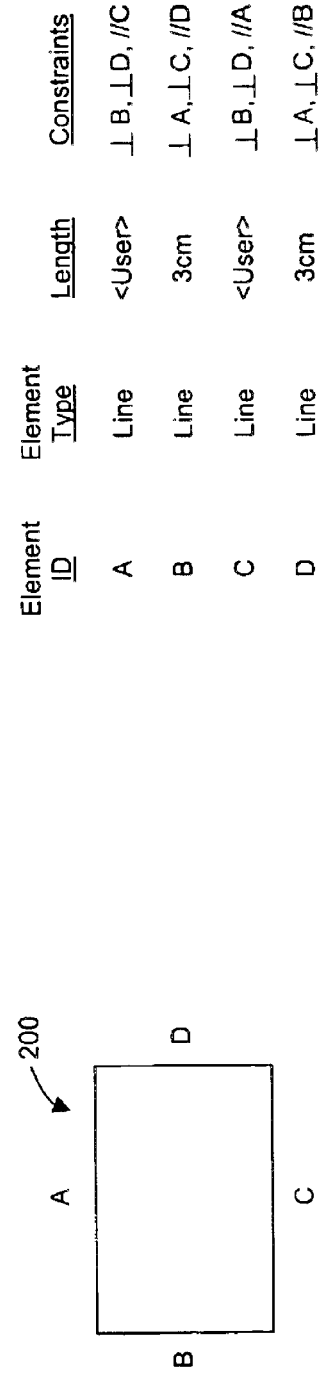
Figure 2a
Figure 2b
Figure 2c

METHOD AND APPARATUS FOR VIEWING A MECHANICAL DESIGN

BACKGROUND OF THE INVENTION

1. Field of the Invention

The present invention relates to the field of computer aided design (CAD). More specifically, the present invention relates to methods for viewing a mechanical design, and apparatuses for practicing the viewing methods.

2. Background Information

Prior art CAD tools typically describe a mechanical design in terms of various geometric shapes, also referred to as "parts". Each part in turn is expressed as a step-by-step recipe incrementally building the various features of the geometric shape, with each step roughly corresponding to a feature. In other words, each part is formed through a linear sequence of steps. For example, a linear step sequence may specify a particular geometric shape is to be formed by starting with a block, cutting a slot at a first location (a first feature), then cutting another angled slot at a second location (a second feature), and so forth. By changing the different design parameters of the "recipe", different embodiments of the geometric shape may be built.

The prior art linear sequence approach to modeling geometric shapes of a mechanical design suffers from at least a number of disadvantages:

a) a significant number of topics or issues associated with the modeling of a mechanical design can not be expressed as features, e.g. equations to create cost, stress and so forth;

b) linear sequences are difficult to manipulate and reorder; and c) linear sequences do not adapt well to reuse analysis, i.e. the reuse of a subpart of one mechanical design in another mechanical design.

The fact that linear sequences do not adapt well to reuse analysis is especially problematic for CAD tools, as increasingly, mechanical designers desire to be able to reuse various subparts of their mechanical designs, in particular, the "standard" or "common" building block subparts employed in otherwise highly complex mechanical designs. Thus, a more effective and efficient approach to expressing mechanical designs and facilitating manipulation of the mechanical designs to allow different subparts of one mechanical design to be easily reuse in another, is desired.

SUMMARY OF THE INVENTION

In accordance with a first aspect of the invention, a viewer selects a first subpart of a mechanical design. In response, one or more graphical elements of a dependent graph of the mechanical design are highlighted for the viewer. The highlighted graphical elements are associated with the selected subpart of the mechanical design. In accordance with another aspect of the invention, the viewer selects graphical elements of the dependent graph. In response, a subpart of the mechanical design is highlighted for the viewer. The highlighted subpart is associated with the selected graphical elements. The viewer may alternate back and forth between the two aspects to explore the mechanical design.

BRIEF DESCRIPTION OF DRAWINGS

The present invention will be described by way of exemplary embodiments, but not limitations, illustrated in the accompanying drawings in which like references denote similar elements, and in which:

FIGS. 2a–2c illustrate a mechanical design, its data and its dependent graph in accordance with one example;

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation. The phrase "in one embodiment" will be employed from time to time, and it is not intended to necessarily refer to the same embodiment.

Figure 1:
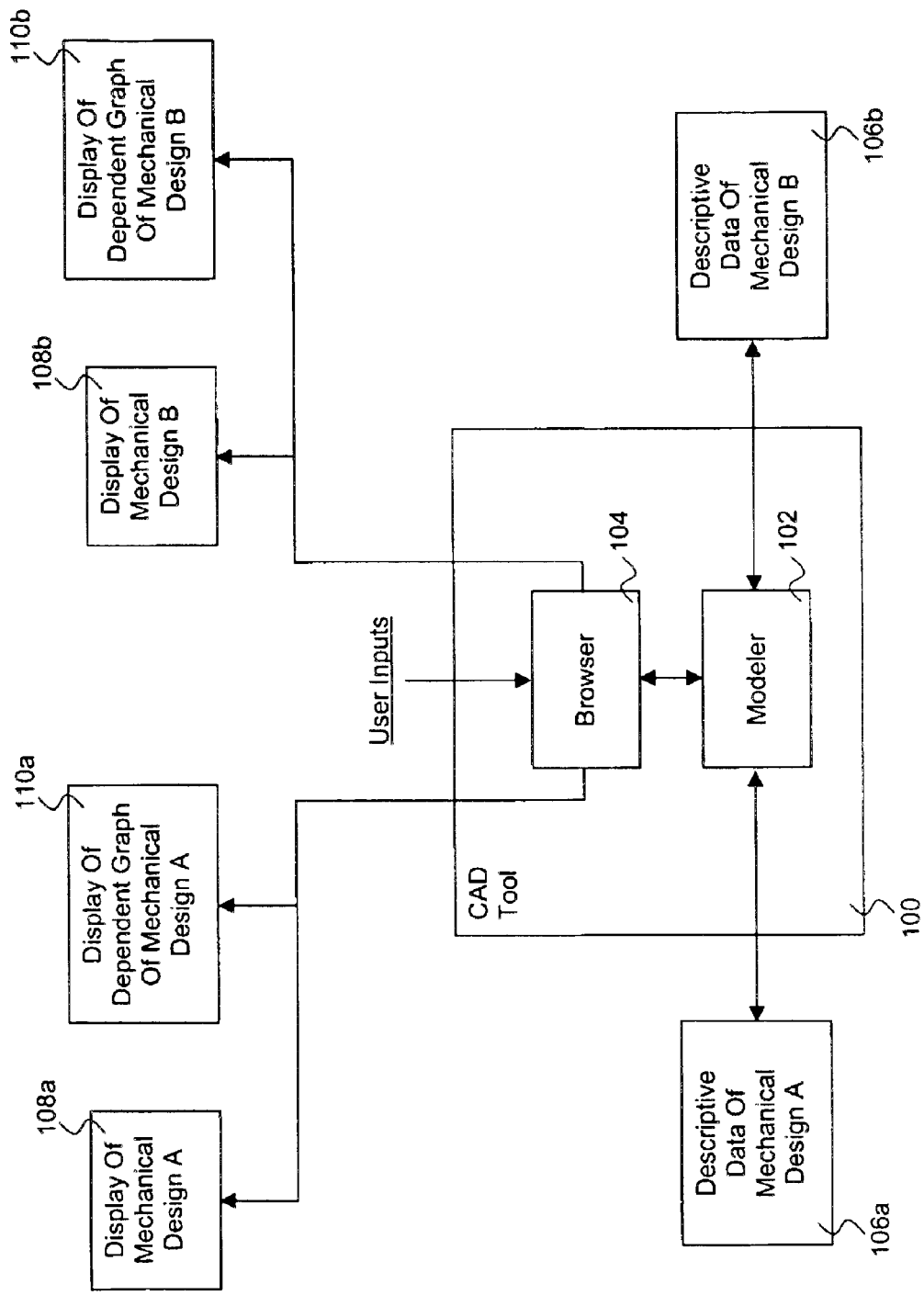
FIG. 1 illustrates an overview of the present invention in accordance with one embodiment.

Referring now to FIG. 1, wherein a block diagram illustrating an overview of the present invention in accordance with one embodiment is shown. As illustrated, CAD tool 100 includes modeler 102 and browser 104. As in prior art, modeler 102 models mechanical designs (hereinafter, simply designs), while browser 104 facilitates display of the modeled designs and related information for the designer, as well as facilitates input by the designer. However, unlike prior art, in accordance with the present invention, modeler 102 models designs employing dependent graphs, and using data 106a–106b suitably organized for the dependent graph approach, to be described more fully below, whereas browser 104 not only facilitates display of the designs 108a–108b and their dependant graphs 110a–110b, but facilitates their displays in a novel coordinated manner. As will be readily apparent from the description to follow, the present invention advantageously enables a designer to be able to efficiently reuse subparts of one design in another design. In particular, the present invention advantageously enables a designer to be able to efficiently explore the interrelationship between various subparts of a modeled design and its dependant graph, thereby allowing the designer to efficiently leverage on the reuse support offered by CAD tool 100.

Except for the teachings of the present invention incorporated, modeler 102 and browser 104 are otherwise intended to represent a broad range of these elements known in the art. Thus, except for the teachings incorporated, which are described in more details below, modeler 102 and browser 104 will not be otherwise further described.

Refer now to FIGS. 2a–2c, wherein three diagrams illustrating the relationship between an example modeled design, its data and dependent graph, in accordance with one embodiment, are shown. As illustrated in FIG. 2a, example design 200 is a simple rectangle having four sides A through D. FIG. 2c, illustrates example dependent graph 202 employed by modeler 102 to model design 200. As illustrated, example dependent graph 202 includes nodes 204, nodes 206, and arcs 208 linking nodes 204 and 206 to one another. Nodes 204 and 206 represent "atomic" design variables of example design 200, i.e. they represent the "lowest level" information building blocks for modeling example design 200. Examples of these "lowest level" information building blocks are numbers, lines, points, and so forth. Nodes 204 are referred to as independent nodes representing independent design variables, whereas nodes 206 are referred to as dependent nodes representing dependent design variables. Dependent design variables are those design variables that cannot be resolved until other design variables are resolved first. Thus, arcs 208 represent dependencies between the design variables represented by nodes 204 and 206. For example, nodes 206 directly representing lines A–D of rectangle 200 are linked to nodes 204 defining lines A–D's dimension, as well as to one another, by arcs 208 representing the "length of", perpendicular, and parallel relationships between these nodes. Two example types of "dimension" nodes 204 are illustrated, "3 cm" and "<user input>". Nodes 206 linked to "3 cm" node 204 represent the length of the lines represented by the particular nodes 206 are invariantly assigned the value "3 cm", whereas nodes 206 linked to "<user input>" node 204" represent the length of the lines represented by the particular nodes 206 are eligible to have their lengths variably assigned by the designer.

As shown in FIG. 2b, for the illustrated embodiment, the descriptive data of example design 200 processed by modeler 102 to generate dependent graph 202 are organized in a tabular manner. As those skilled in the art will appreciate that any one of a number of other known data organizations may also be employed to store the descriptive data of a design.

Furthermore, while for ease of understanding, the interrelationships between a design, its data and its dependent graph have been illustrated with the simple example design of a rectangle, as those skilled in the art will appreciate that the principles are nevertheless fully scalable to highly complex designs having large quantities of data and complicated dependent graphs.

Figure 3:
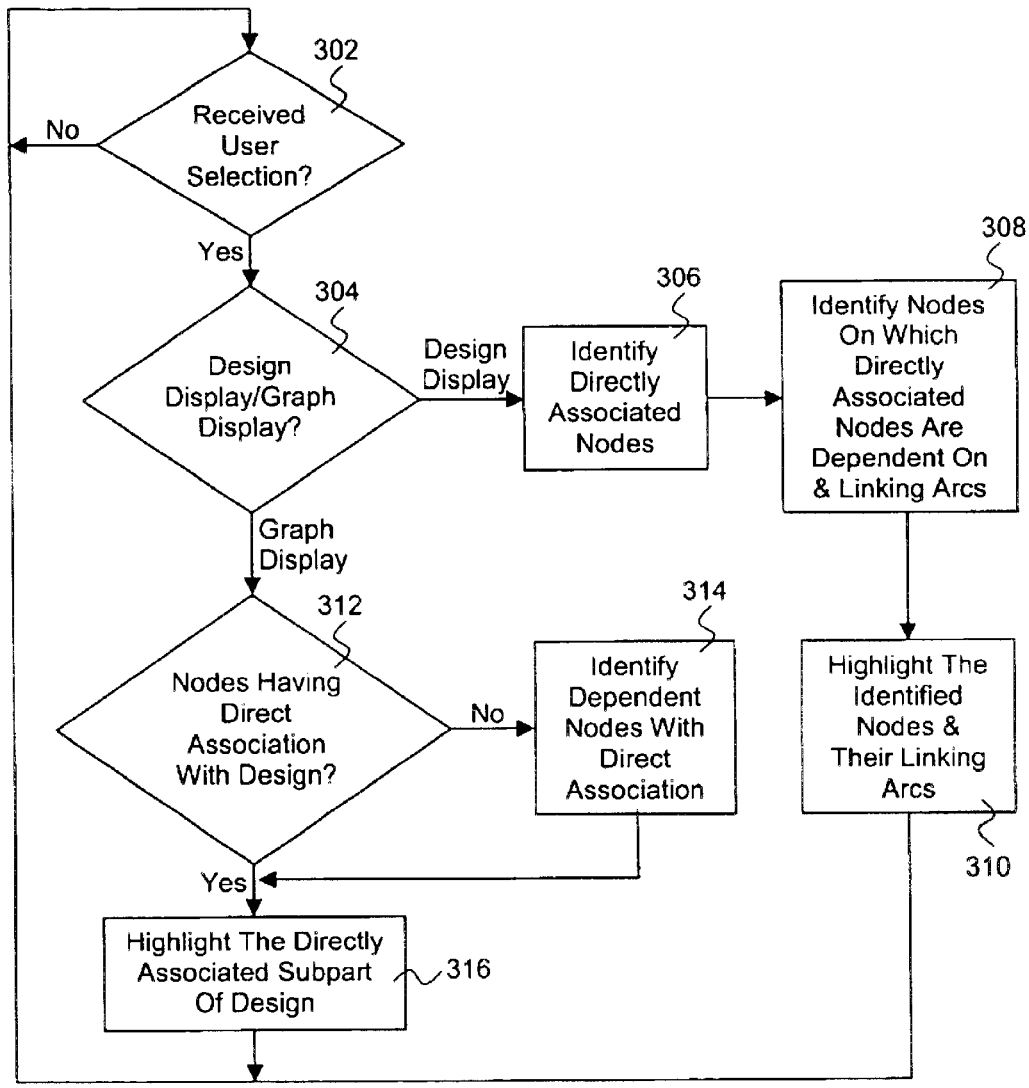
FIG. 3 illustrates the method of the present invention for viewing a mechanical design and its dependent graph in accordance with one embodiment.

Refer now to FIG. 3, wherein a flow diagram illustrating the operational flow of browser 104 for facilitating exploration of a modeled design and its dependent graph, in accordance with one embodiment, is shown. As illustrated, at 302, browser 104 receives certain selection inputs from the user. The selection may be denoted and communicated to browser 104 in any one of a number of techniques known in the art, e.g. using a cursor control device and posting messages for browser 104 responsive to certain predetermined cursor control device events. In response, at 304, browser 104 determines whether the selections were made in reference to the design displayed 108a/108b or in reference to their dependent graphs 110a/110b. The determination may also be made in accordance with any one of a number of techniques known in the art, e.g. by having the messages include identification information of the "focus" window at the time the cursor control device events arose.

If it is determined at 304 that the selections were made in reference to the design displayed 108a/108b, at 306, browser 104 identifies the dependent graph nodes that are directly associated with the subpart of the mechanical design selected. Additionally, at 308, browser 104 further identifies all other dependent graph nodes to which the directly associated nodes are dependent on, directly or indirectly, and the arcs that link these nodes to one another. The identification process may be implemented using any one of a number of known "tracing" techniques, to systematically follow the arcs to all the independent nodes on which the directly associated nodes are dependent on. At 310, browser 104, refreshes dependant graph display 110a/110b to reflect the nodes and arcs identified.

Similarly, if it is determined at 304 that the selections were made in reference to the dependent graph displayed 110a/110b, at 312, browser 104 determines whether the graphical elements selected are directly associated with specific subparts of the mechanical design. If the graphical elements selected are not directly associated with specific subpart of the mechanical design, at 314, browser 104 follows the arcs radiating from the selected graphical elements to identify the "nearest" directly associated nodes. Upon either having received identifications of the directly associated nodes directly, or determined the directly associated nodes, at 316, browser 104 refreshes design display 108a/108b to highlight the directly associated subparts.

Operations 302–316 may be repeated as many times as it is necessary, alternating between the two basic paths as desired, i.e. selecting subparts of a design and selecting graphical elements of the dependent graph, to facilitate a designer in exploring and understanding a design. As those skilled in the art will appreciate, the above described novel coordinated approach to facilitate viewing of a design and its dependent graph is particularly useful for facilitating a designer in exploring the various subparts of a design, and reusing selected ones of the subparts in another design.

Figure 4:
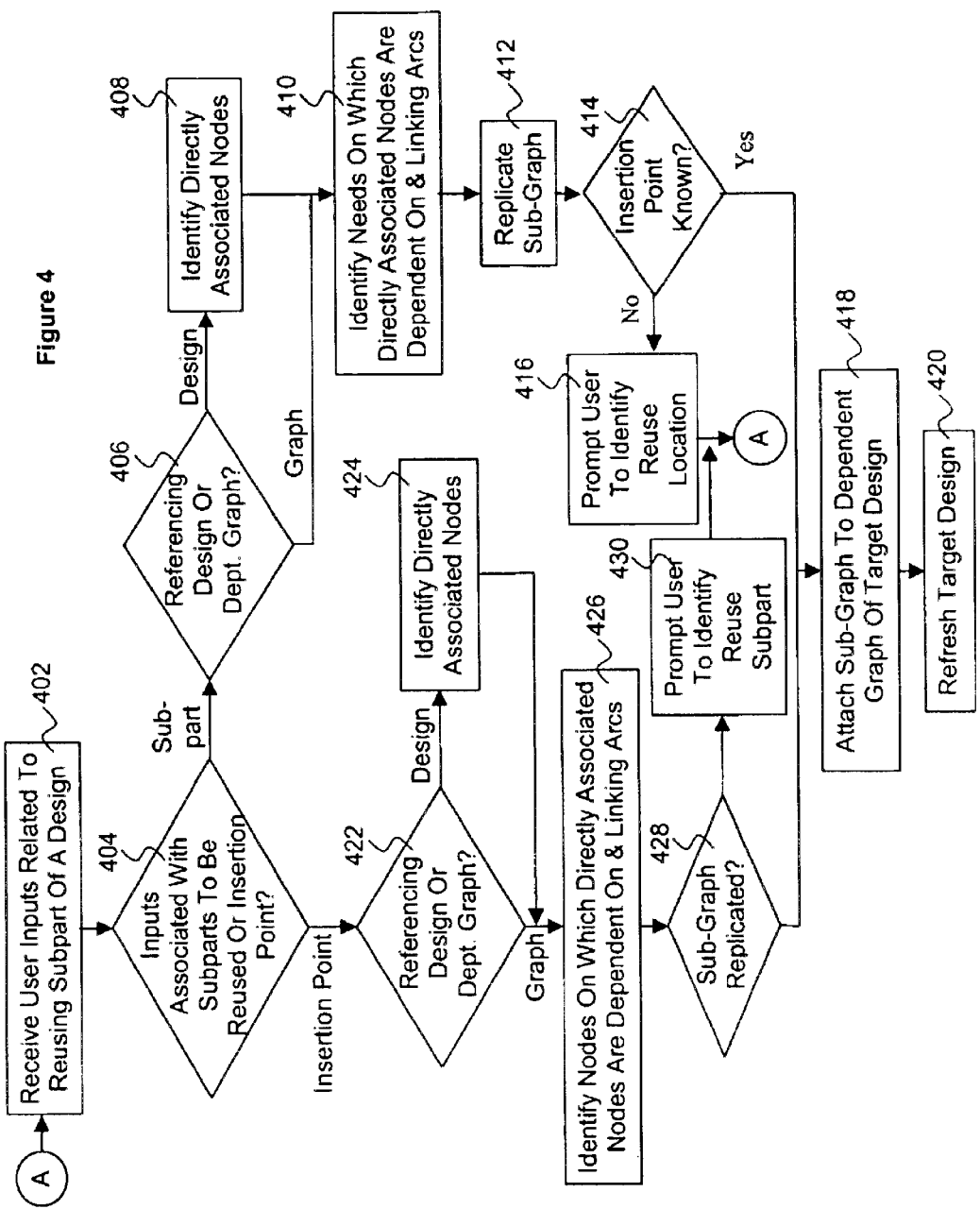
FIG. 4 illustrates the method of the present invention for reusing subparts of a mechanical design in another mechanical design in accordance with one embodiment.

Referring now to FIG. 4, wherein a flow diagram illustrating the operational flow of modeler 102 for facilitating reuse of a subpart of one design in another design, in accordance with one embodiment, is shown. As illustrated, at 402, modeler 102 receives (e.g. by way of browser 104) certain design subpart reuse related identification inputs from the user. In response, modeler 102, at 404, determines whether the inputs are associated with the identification of a subpart of one design to be reused in another design, or the inputs are associated with the identification of a point or an area of a target design on which a subpart of another design is to be inserted or reused.

If it is determined at 404 that the inputs are associated with the identification of a subpart of one design to be reused in another design, at 406, modeler 102 further determines if the inputs were provided referencing the dependent graph or the modeled design itself. If it is determined at 406 that the inputs were provided referencing the modeled design itself, at 408, modeler 102 first identifies the dependent graph nodes directly associated with the selected subpart of the design to be reused. If it is determined at 406 that the inputs were provided referencing the dependent graph or upon identifying the directly associated nodes at 408, at 410, modeler 102 identifies the dependent graph nodes on which the directly associated nodes are dependent, directly as well as indirectly, and the arcs linking these nodes to one another. As described earlier, the determination process may be implemented using any one of a number of known "tracing" techniques, to systematically follow the linking arcs to the independent nodes on which the directly associated nodes are dependent. Once all the dependent and independent nodes, and the arcs linking them are identified for the selected subpart to be reused, at 412, modeler 102 replicates the sub-graph, i.e. creating a copy of the identified dependent and independent nodes, and their linking arcs.

Having replicated the sub-graph, at 414, modeler 102 determines if the insertion points in the dependent graph of the target design have been determined. If the insertion points have not been identified, at 416, modeler 102 in cooperation with browser 104 prompts the user to identify the point or area where the subpart is to be reused (i.e. inserted). If the insertion points have been identified, at 418, modeler 102 attaches the replicated sub-graph to the dependent graph of the target design to reuse the selected subpart with the target design. Lastly, at 420, modeler 102 refreshes target design's display 108a/108b as well as the dependent graph display 110a/110b.

Back at 404, if it was determined that the inputs received were associated with identifying the insertion point or area of a target design, at 422, modeler 102 further determines whether the inputs were provided referencing target design's display 108a/108b or referencing its dependent graph display 110a/110b. If the inputs were provided referencing target design's display 108a/108b, at 424, modeler 102 first identifies the dependent graph nodes directly associated with the identified insert point or area of the target design. Upon either determining that the inputs were provided referencing the dependent graph or having identified the dependent graph nodes directly associated with the insertion point/area, at 426, modeler 102, further identifies other dependent graph nodes on which the identified/directly associated insertion point nodes are directly or indirectly dependent, and the arcs linking these nodes to each other.

Having identified the insertion points in the dependent graph of the target design, at 428, modeler 102 determines if the sub-graph modeling the subpart to be reused has been generated (i.e. replicated). If the sub-graph has not been generated, at 430, modeler 102 in cooperation with browser 104 prompts the user to identify the subpart to be reused. Upon receipt of the identification of the subpart to be reused, the process continues as described earlier. If the sub-graph has been generated, modeler 102 proceeds with the attachment and refresh operations of 418 and 420 as described earlier.

In one embodiment, modeler 102 further provides a user with the opportunity to transform selected ones of the design variables (nodes) from having assigned constant values to being eligible to have their values variably assigned, or vice versa. In one embodiment, modeler 102 offers the transformation option to the user, one applicable design variable at a time, as it processes the independent nodes while performing attachment operation 418.

Figure 5:
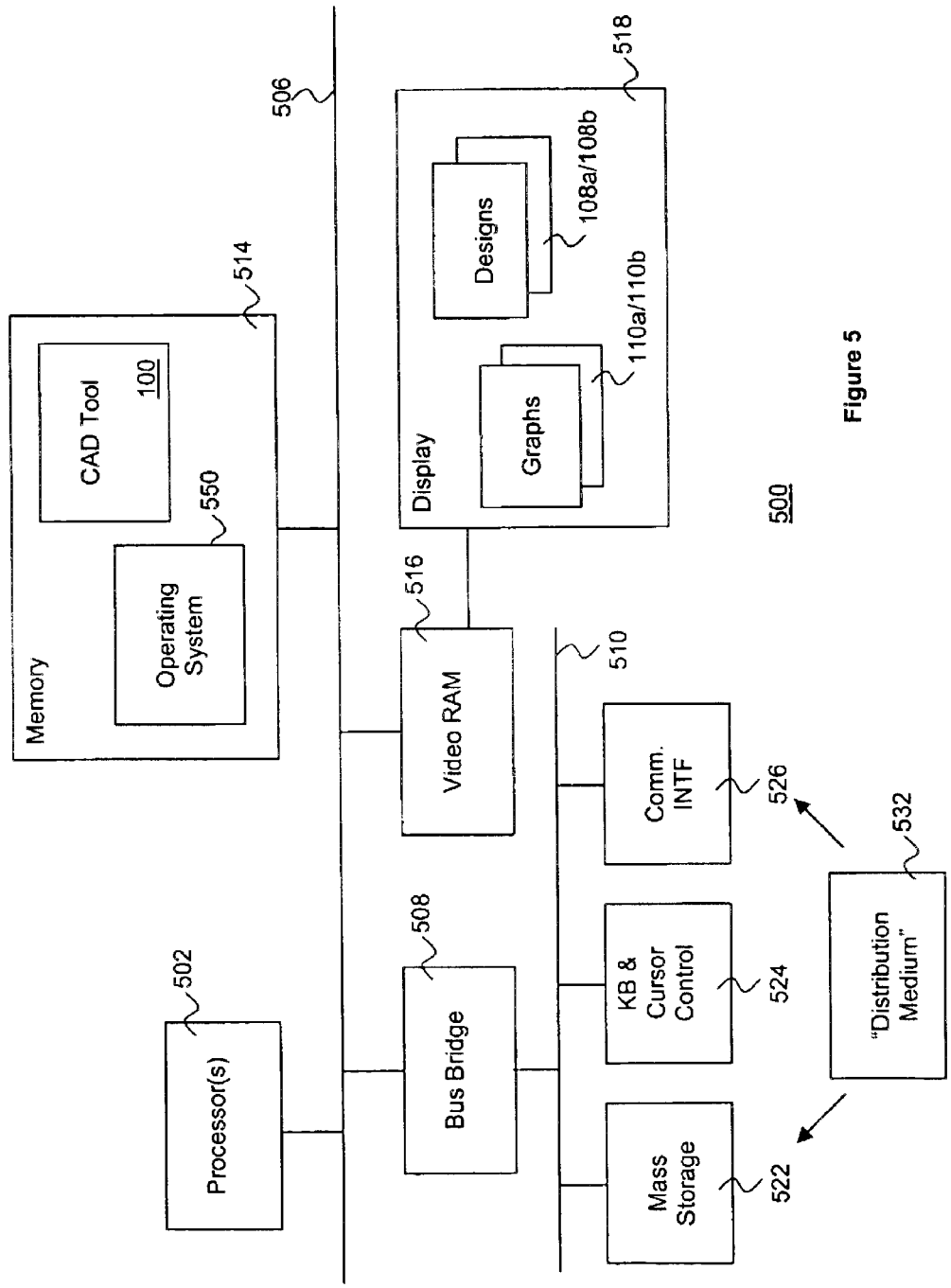
FIG. 5 illustrates one embodiment of a computer system suitable for programming with instructions implementing the present invention.

FIG. 5 illustrates one embodiment of a computer system suitable to be programmed with programming instructions implementing the CAD tool incorporated with the teachings of the present invention. As shown, for the illustrated embodiment, computer 500 includes processor 502, system bus 506 and I/O bus 510. System bus 506 and I/O bus 510 are bridged by bus bridge 508. Coupled to system bus 506 are system memory 514 and video memory 516, against which video display 518 is coupled. Coupled to I/O bus 510 are disk drive 522, keyboard and pointing device 524, and communication interface 526. Most importantly, computer 500 is programmed with CAD tool 100 incorporated with the teachings of the present invention as described earlier, and operating system 550.

The elements perform their conventional functions known in the art, except CAD tool 100 which performs its otherwise conventional functions in accordance with the present invention. In particular, disk drive 522 and system memory 514 are used to store permanent and working copies of CAD tool 100 and operating system 550, and video display 518 is used to display e.g. design displays 108a/108b and dependent graph displays 110a/110b. The permanent copies may be pre-loaded into disk drive 522 in a factory, loaded from distribution medium 532, or down loaded from a remote distribution source (not shown). Distribution medium 532 may be a tape, a CD, a DVD or other storage medium of the like. The constitutions of these elements are known. Any one of a number of implementations of these elements known in the art may be used to form computer system 500. In alternate embodiments, other components may also be used in addition to or in lieu of the components described, e.g. additional processors. In selected ones of these multiprocessor embodiments, execution of the programming instructions implementing CAD tool 100 incorporated with the teachings of the present invention may also be distributed among the processors.

In general, those skilled in the art will recognize that the present invention is not limited by the details described, instead, the present invention can be practiced with modifications and alterations within the spirit and scope of the appended claims. The description is thus to be regarded as illustrative instead of restrictive on the present invention.

Thus, a method and an apparatus for viewing a mechanical design have been described.

What is claimed is:

1. In a computer aided design environment, a method comprising:

receiving a selection of a first subpart of a mechanical design;

providing a display of a dependent graph of said mechanical design, the dependent graph including a plurality of nodes and one or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes; and highlighting, in response to the selection of the first subpart, a first plurality of graphical elements of the dependent graph of said mechanical design, wherein said highlighted first plurality of graphical elements comprises a first plurality of nodes associated with the selected first subpart of the mechanical design and a first one or more arcs linking said first plurality of nodes where said first plurality of nodes correspondingly represents a first plurality of atomic design variables of said first subpart.

2. The method of claim 1 wherein said arcs include information about one or more dependency relationships between nodes connected by said arcs.

3. The method of claim 1 wherein one or more of said arcs link said first plurality of nodes in accordance with the plurality of atomic design variables' dependency on one another.

4. The method of claim 1 wherein said highlighting comprises highlighting selected ones of said first plurality of nodes that are directly associated with said selected first subpart, selected ones of said first plurality of nodes on which the directly associated nodes are directly or indirectly dependent, and selected ones of said first one or more arcs linking these nodes to one another.

5. The method of claim 1 further comprising:
receiving a selection of a second plurality of graphical elements of the display of the dependent graph of said mechanical design; and
highlighting, in response, a second subpart of said mechanical design, the highlighted second subpart being associated with said selected second plurality of graphical elements.

6. The method of claim 5 wherein said dependent graph includes a second plurality of nodes correspondingly representing a plurality of atomic design variables of said mechanical design, and a second one or more arcs liking the second plurality of nodes in accordance with the plurality of atomic design variables' dependency on one another.

7. The method of claim 5 wherein said highlighting comprises highlighting selected ones of said second plurality of nodes that are directly associated with said selected first subpart, selected ones of said second plurality of nodes on which the directly associated nodes are directly or indirectly dependent, and selected ones of said second one or more arcs linking these nodes to one another.

8. The method of claim 5 wherein said received selection of second one or more graphics elements comprises third selected ones of said plurality of nodes that are directly associated with the selected first subpart, fourth selected ones of said plurality of nodes on which the third selected nodes are directly or indirectly dependant, and third selected ones of said arcs link the third and forth selected nodes to one another.

9. The method of claim 1, wherein the dependent graph further includes dependency information associated with each of the one or more arcs linking the plurality of nodes, wherein dependency information associated with the arc linking two nodes describes a constraint relationship between the atomic design variables represented by the linked nodes.

10. In a computer aided design environment, a method comprising:
providing a display of a dependent graph of a mechanical design, the dependent graph including a plurality of nodes and one or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes;
receiving selection of a first plurality of graphical elements of the dependent graph, said received selection comprising a plurality of nodes associated with a first subpart of said mechanical design and one or more arcs linking said plurality of nodes wherein said first plurality of nodes correspondingly represents atomic design variables of said first subpart; and
highlighting in response to the selection of a first plurality of graphical elements the first subpart of said mechanical design.

11. The method of claim 10 wherein said received selection comprises selected ones of said plurality of nodes that are directly associated with said first subpart, selected ones of said plurality of nodes on which the directly associated nodes are directly or indirectly dependent, and selected ones of said one or more arcs linking these nodes together.

12. The method of claim 10, wherein the dependent graph further includes dependency information associated with each of the one or more arcs linking the plurality of nodes, wherein dependency information associated with the arc linking two nodes describes a constraint relationship between the atomic design variables represented by the linked nodes.

13. An article of manufacture comprising a machine readable medium having recorded thereon a plurality of programming instructions for use by an apparatus to enable said apparatus to:
receive a selection of a first subpart of a mechanical design;
provide a display of a dependent graph of said mechanical design, the dependent graph including a plurality of nodes and one or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes; and
highlight, in response to the selection of the first subpart, a first plurality of graphical elements the dependent graph of said mechanical design, wherein said highlighted first plurality of graphical elements comprises a first plurality of nodes associated with the selected first subpart of the mechanical design and a first one or more arcs linking said first plurality of nodes wherein said first plurality of nodes correspondingly represents a first plurality of atomic design variables of said first subpart.

14. The article of manufacture of claim 13 wherein said arcs includes information about one or more dependency relationships between nodes connected by said arcs.

15. The article of manufacture of claim 13 wherein one or more of said arcs link said first plurality of nodes in accordance with the plurality of atomic design variables' dependency on one another.

16. The article of manufacture of claim 13 wherein said highlighting comprises highlighting selected ones of said first plurality of nodes that are directly associated with said selected first subpart, selected ones of said first plurality of nodes on which the directly associated nodes are directly or indirectly dependent, and selected ones of said first one or more arcs linking these nodes to one another.

17. The article of manufacture of claim 13 wherein the instructions further enable the apparatus to:
receive a selection of a second plurality of graphical elements of the display of the dependent graph of said mechanical design; and
highlight, in response, a second subpart of said mechanical design, the highlighted second subpart being associated with said selected second plurality of graphical elements.

18. The article of manufacture of claim 17 wherein said dependent graph includes a second plurality of nodes correspondingly representing a plurality of atomic design variables of said mechanical design, and a second one or more arcs linking the second plurality of nodes in accordance with the plurality of atomic design variables' dependency on one another.

19. The article of manufacture of claim 17 wherein said highlighting comprises highlighting selected ones of said second plurality of nodes that are directly associated with said selected first subpart, selected ones of said second plurality of nodes on which the directly associated nodes are directly or indirectly dependent, and selected ones of said second one or more arcs linking these nodes to one another.

20. The article of manufacture of claim 17 wherein said received selection of second one or more graphics elements comprises third selected ones of said plurality of nodes that are directly associated with the selected first subpart, fourth selected ones of said plurality of nodes on which the third selected nodes are directly or indirectly dependant, and third selected ones of said arcs link the third and fourth selected nodes to one another.

21. The article of manufacture of claim 13, wherein the dependent graph further includes dependency information associated with each of the one or more arcs linking the plurality of nodes, wherein dependency information associated with the arc linking two nodes describes a constraint relationship between the atomic design variables represented by the linked nodes.

22. An article of manufacture comprising a machine readable medium having recorded thereon a plurality of programming instructions for use by an apparatus to enable said apparatus to:
provide a display of a dependent graph of a mechanical design, the dependent graph including a plurality of nodes and one or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes;
receive selection of a first plurality of graphical elements of the dependent graph of the mechanical design, said received selection of a plurality of graphical elements comprising a plurality of nodes associated with a first subpart of said mechanical design and one or more arcs linking said plurality of nodes wherein said first plurality of nodes correspondingly represents atomic design variables of said first subpart; and
highlight in response to the selection of the first plurality of graphical elements the first subpart of said mechanical design.

23. The article of manufacture of claim 22 wherein said received selection comprises selected ones of said plurality of nodes that art directly associated with said first subpart, selected ones of said plurality of nodes on which the directly associated nodes are directly or indirectly dependent, and selected ones of said one or more arcs linking these nodes together.

24. The article of manufacture of claim 22, wherein the dependent graph further includes dependency information associated with each of the one or more arcs linking the plurality of nodes, wherein dependency information associated with the arc linking two nodes describes a constraint relationship between the atomic design variables represented by the linked nodes.

25. An apparatus comprising:
a machine readable medium having recorded thereon a plurality of programming instructions;
a processor coupled to said machine readable medium to execute said plurality of programming instruction which operate to:
receive a selection of a first subpart of a mechanical design;
provide a display of a dependent graph of said mechanical design, the dependent graph including a plurality of nodes and on or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes; and
highlight, in response to the selection of the first subpart, a first plurality of graphical elements of the dependent graph of said mechanical design, wherein said highlighted first plurality of graphical elements comprises a first plurality of nodes associated with the selected first subpart of the mechanical design and a first one or more arcs linking said first plurality of nodes wherein said first plurality of nodes correspondingly represents atomic design variables of said first subpart.

26. The apparatus of claim 25 wherein said arcs convey information about one or more dependency relationships between nodes connected by said arcs.

27. The apparatus of claim 25 wherein one or more of said arcs link said first plurality of nodes in accordance with the plurality of atomic design variables' dependency on one another.

28. The apparatus of claim 25 wherein said highlighting comprises highlighting selected ones of said first plurality of nodes that are directly associated with said selected first subpart, selected ones of said first plurality of nodes on which the directly associated nodes are directly or indirectly dependent, and selected ones of said first one or more arcs linking these nodes to one another.

29. The apparatus of claim 25 wherein the instructions further enable the apparatus to:
receive a selection of a second plurality of graphical elements of the display of the dependent graph of said mechanical design; and
highlight, in response, a second subpart of said mechanical design, the highlighted second subpart being associated with said selected second plurality of graphical elements.

30. The apparatus of claim 29 wherein said dependent graph includes a second plurality of nodes correspondingly representing a plurality of atomic design variables of said mechanical design, and a send one or more arcs linking the second plurality of nodes in accordance with the plurality of atomic design variables' dependency on one another.

31. The apparatus of claim 29 wherein said highlighting comprises highlighting selected ones of said second plurality of nodes that are directly associated with said selected first subpart, selected ones of said second plurality of nodes on which the directly associated nodes are directly or indirectly dependent, and selected ones of said second one or mote arcs linking these nodes to one another.

32. The apparatus of claim 29 wherein said received selection of second one or more graphics elements comprises third selected ones of said plurality of nodes that are directly associated with the selected first subpart, fourth selected ones of said plurality of nodes on which the third selected nodes are directly or indirectly dependant, and third selected ones of said arcs link the third and fourth selected nodes to one another.

33. The apparatus of claim 25, wherein the dependent graph further includes dependency information associated with each of the one or more arcs linking the plurality of nodes, wherein the dependency information associated with the arc linking two nodes describes a constraint relationship between the atomic design variables represented by the linked nodes.

34. An apparatus comprising:
- a machine readable medium having recorded thereon a plurality of programming instructions; and
- a processor coupled to said machine readable medium to execute said plurality of programming instruction which operate to:
  - provide a display of a dependent graph of a mechanical design, the dependent graph including a plurality of nodes and one or more arcs linking the plurality of nodes, where a node corresponds to an atomic design variable, an atomic design variable representing a lowest level information building block to the mechanical design, and an arc linking two nodes represents a dependency between the atomic design variables represented by the linked nodes;
  - receive selection of a first plurality of graphical elements of the dependent graph of a mechanical design, said received selection of a plurality of graphical elements comprising a plurality of nodes associated with a first subpart of said mechanical design and one or more arcs linking said plurality of nodes wherein said first plurality of nodes correspondingly represents atomic deign variables of said subpart; and
  - highlight in response to the selection of a first plurality of graphical elements the first subpart of said mechanical design.

35. The apparatus of claim 34, wherein said received selection comprises selected ones of said plurality of nodes that are directly associated with said first subpart, selected ones of said plurality of nodes on which the directly associated nodes are directly or indirectly dependent, and selected ones of said one or more arcs linking these nodes together.

36. The apparatus of claim 34, wherein the dependent graph further includes dependency information associated with each of the one or more arcs linking the plurality of nodes, wherein the dependency information associated with the arc linking two nodes describes a constraint relationship between the atomic design variables represented by the linked nodes.

* * * * *

UNITED STATES PATENT AND TRADEMARK OFFICE
CERTIFICATE OF CORRECTION

PATENT NO. : 6,859,201 B1
DATED : February 22, 2005
INVENTOR(S) : Kapil D. Singh It is certified that error appears in the above-identified patent and that said Letters Patent is hereby corrected as shown below:

<u>Title page,</u>
Item [56], References Cited, U.S. PATENT DOCUMENTS, add:
-- 5,512,935    A    *    04/1996    Majeti et al.    725/53
5,991,799    A    *    11/1999    Yen et al.    709/218
6,128,653    A    *    10/2000    del Val et al.    709/219
6,173,317    B1    *    01/2001    Chaddha et al.    709/219 --.

<u>Column 7,</u>
Line 28, replace "one or more arcs liking" with -- one or more arcs linking --.
Line 44, replace "the third and forth selected nodes" with -- the third and fourth selected nodes --.

<u>Column 9,</u>
Line 56, replace "nodes that art directly associated" with -- nodes that are directly associated --.

<u>Column 10,</u>
Line 11, replace "plurality of nodes and on or more" with -- plurality of nodes and one or more --.
Line 55, replace "send one or more arcs linking" with -- second one or more arcs linking --.
Line 63, replace "second one or mote arcs" with -- second one or more arcs --.

<u>Column 11,</u>
Line 3, replace "directly or indirectly dependant" with -- directly or indirectly dependent --.
Line 9, replace "wherein the dependency information" with -- wherein dependency information --.
Line 17, replace "plurality of programming instruction" with -- plurality of programming instructions --.

UNITED STATES PATENT AND TRADEMARK OFFICE
CERTIFICATE OF CORRECTION

PATENT NO.    : 6,859,201 B1
DATED         : February 22, 2005
INVENTOR(S)   : Kapil D. Singh It is certified that error appears in the above-identified patent and that said Letters Patent is hereby corrected as shown below:

Column 12,
Line 8, replace "atomic deign variables of said" with -- atomic design variables of said first --.
Line 23, replace "wherein the dependency information" with -- wherein dependency information --.

Signed and Sealed this

Fourth Day of October, 2005

JON W. DUDAS
*Director of the United States Patent and Trademark Office*